(12) United States Patent
Akerib et al.

(10) Patent No.: US 8,908,465 B2
(45) Date of Patent: Dec. 9, 2014

(54) USING STORAGE CELLS TO PERFORM COMPUTATION

(75) Inventors: Avidan Akerib, Tel Aviv (IL); Oren Agam, Zichron Yaakov (IL); Eli Ehrman, Beit Shemesh (IL); Moshe Meyassed, Kadima (IL)

(73) Assignee: Mikamonu Group Ltd., Tel Aviv (IL)

( * ) Notice: Subject to any disclaimer, the term of this patent is extended or adjusted under 35 U.S.C. 154(b) by 0 days.

(21) Appl. No.: 13/437,955

(22) Filed: Apr. 3, 2012

(65) Prior Publication Data

US 2012/0243284 A1    Sep. 27, 2012

Related U.S. Application Data

(62) Division of application No. 12/503,916, filed on Jul. 16, 2009, now Pat. No. 8,238,173.

(51) Int. Cl.
*G11C 8/00* (2006.01)
*G11C 15/04* (2006.01)
*G11C 29/34* (2006.01)

(52) U.S. Cl.
CPC .............. *G11C 29/34* (2013.01); *G11C 15/043* (2013.01)
USPC .................. 365/230.06; 365/189.07; 365/49.1

(58) Field of Classification Search
USPC ............................................. 365/49.1–49.18
See application file for complete search history.

(56) References Cited

U.S. PATENT DOCUMENTS

| 4,996,666 | A | * | 2/1991 | Duluk, Jr. ..................... 365/49.1 |
| 5,072,422 | A | | 12/1991 | Rachels |
| 5,426,602 | A | * | 6/1995 | Lukoff ....................... 365/49.15 |
| 5,428,565 | A | * | 6/1995 | Shaw ......................... 365/49.17 |
| 5,446,686 | A | * | 8/1995 | Bosnyak et al. ............ 365/49.17 |
| 5,450,351 | A | * | 9/1995 | Heddes ........................ 365/49.1 |
| 5,859,791 | A | * | 1/1999 | Schultz et al. ............. 365/49.15 |
| 6,373,761 | B1 | | 4/2002 | Shore et al. |
| 6,421,265 | B1 | * | 7/2002 | Lien et al. .................. 365/49.15 |
| 6,571,352 | B2 | | 5/2003 | Blodgett |
| 6,697,276 | B1 | * | 2/2004 | Pereira et al. .............. 365/49.17 |
| 6,732,238 | B1 | | 5/2004 | Konas et al. |
| 6,785,153 | B2 | | 8/2004 | Regev et al. |
| 7,181,568 | B2 | * | 2/2007 | Rosenbluth et al. .......... 711/108 |
| 7,301,792 | B2 | * | 11/2007 | Gould et al. ............... 365/49.15 |
| 7,752,412 | B2 | * | 7/2010 | Tomlin et al. ................. 711/170 |
| 7,965,564 | B2 | | 6/2011 | Lavi et al. |
| 2002/0108073 | A1 | | 8/2002 | Hughes |
| 2005/0237792 | A1 | | 10/2005 | Johnson |
| 2005/0248970 | A1 | * | 11/2005 | Regev et al. .................... 365/49 |

(Continued)

OTHER PUBLICATIONS

U.S. Appl. No. 13/233,065.*

(Continued)

*Primary Examiner* — Kretelia Graham
(74) *Attorney, Agent, or Firm* — Eitan, Mehulal & Sadot

(57) ABSTRACT

A content addressable memory (CAM) unit does not have any in-cell comparator circuitry. The CAM unit includes a memory array, a multiple row decoder, a controller and an output unit. The memory array has storage cells arranged as data rows and complement rows. The multiple row decoder activates more than one row of the memory array at a time and the controller indicates to the multiple row decoder to activate data rows or complement rows as a function of an input pattern to be matched. The output unit indicates which columns generated a signal, the columns matching the pattern.

6 Claims, 5 Drawing Sheets

(56) References Cited

U.S. PATENT DOCUMENTS

| | | | |
|---|---|---|---|
| 2005/0254315 A1* | 11/2005 | Salters | 365/189.11 |
| 2006/0233011 A1* | 10/2006 | Matsuoka et al. | 365/49 |
| 2007/0195570 A1* | 8/2007 | Hager Cooke | 365/49 |
| 2007/0247884 A1* | 10/2007 | Stewart | 365/49 |
| 2009/0129161 A1 | 5/2009 | Hwang | |
| 2009/0141530 A1 | 6/2009 | Arsovski et al. | |
| 2009/0193022 A1* | 7/2009 | Lapir et al. | 707/6 |
| 2009/0207642 A1 | 8/2009 | Shimano et al. | |
| 2009/0254694 A1* | 10/2009 | Ehrman et al. | 711/100 |
| 2012/0246380 A1* | 9/2012 | Akerib et al. | 711/5 |

OTHER PUBLICATIONS

Avidan J. Akerib; "Associative Real Time Vision Machine", Mar. 1992.*

Akerib, "Associative Real-Time Vision Machine," Department of Applied Mathematics and Computer Science, Weizmann Institute of Science, Rehovot, Israel, Mar. 1992 (Uploaded on Oct. 22, 2013 in six parts due to size of document).

* cited by examiner

| C | B | A | ~C | ~B | ~A | T | T1 | T2 | T | T1 | T2 | T1 | T3 |
|---|---|---|----|----|----|----|----|----|---|----|----|----|----|
| 0 | 0 | 0 | 1 | 1 | 1 | 0 | 0 | 0 | 0 | 1 | 0 | 0 | 0 |
| 0 | 0 | 1 | 1 | 1 | 0 | 0 | 0 | 0 | 0 | 0 | 1 | 0 | 1 |
| 0 | 1 | 0 | 1 | 0 | 1 | 0 | 0 | 0 | 0 | 0 | 1 | 0 | 1 |
| 0 | 1 | 1 | 1 | 0 | 0 | 0 | 0 | 1 | 1 | 0 | 0 | 0 | 0 |
| 1 | 0 | 0 | 0 | 1 | 1 | 1 | 0 | 0 | 0 | 0 | 1 | 0 | 1 |
| 1 | 0 | 1 | 0 | 1 | 0 | 0 | 1 | 0 | 1 | 0 | 0 | 0 | 0 |
| 1 | 1 | 0 | 0 | 0 | 1 | 0 | 1 | 0 | 1 | 0 | 0 | 0 | 0 |
| 1 | 1 | 1 | 0 | 0 | 0 | 0 | 1 | 0 | 1 | 0 | 0 | 1 | 1 |
|   |   |   |   |   |   |   |    |    | C1 |    |    |    | S1 |

USING STORAGE CELLS TO PERFORM COMPUTATION

CROSS-REFERENCE TO RELATED APPLICATIONS

This application is a divisional application claiming benefit from U.S. patent application Ser. No. 12/503,916, filed 16 Jul. 2009, which is hereby incorporated in its entirety by reference.

FIELD OF THE INVENTION

The present invention relates to memory cells generally and to their use for computation in particular.

BACKGROUND OF THE INVENTION

Memory arrays, which store large amounts of data, are known in the art. Over the years, manufacturers and designers have worked to make the arrays physically smaller but the amount of data stored therein larger.

Computing devices typically have one or more memory array to store data and a central processing unit (CPU) and other hardware to process the data. The CPU is typically connected to the memory array via a bus. Unfortunately, while CPU speeds have increased tremendously in recent years, the bus speeds have not increased at an equal pace. Accordingly, the bus connection acts as a bottleneck to increased speed of operation.

SUMMARY OF THE PRESENT INVENTION

There is provided, in accordance with a preferred embodiment of the present invention, a content addressable memory (CAM) unit without any in-cell comparator circuitry.

Moreover, in accordance with a preferred embodiment of the present invention, the CAM unit includes a memory array, a multiple row decoder, a controller and an output unit. The memory array has storage cells arranged as data rows and complement rows. The multiple row decoder activates more than one row of the memory array at a time and the controller indicates to the multiple row decoder to activate data rows or complement rows as a function of an input pattern to be matched. The output unit indicates which columns generated a signal, the columns matching the pattern.

Moreover, in accordance with a preferred embodiment of the present invention, the memory cells may be 3T DRAM cells, SRAM cells, DRAM cells, non-destructive cells or cells which provide a determinate result when multiple cells are read together.

Further, in accordance with a preferred embodiment of the present invention, the output unit includes a write unit to write the result into the memory array.

Moreover, in accordance with a preferred embodiment of the present invention, the memory array has at least a first portion to store data and at least a second portion into which the output unit writes.

Finally, in accordance with a preferred embodiment of the present invention, the CAM unit is a ternary CAM unit or a quarnary CAM unit.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
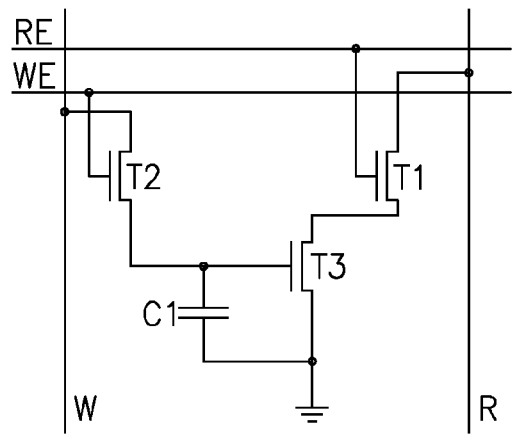
FIG. 1 is a circuit diagram illustration of an exemplary memory cell.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Applicants have realized that computing operations may be performable within the memory array. As an illustration, FIG. 1 illustrates a standard 3T DRAM memory cell, formed of three transistors, T1, T2, T3 and a capacitor C1. The input to transistor T1 is connected to a read (R) line while its gate is connected to a read enable (RE) or a word line. The input to transistor T3 is connected to the output of transistor T1 while its gate is connected to the output of transistor T2, which is the input to capacitor C1. The output of transistor T2 is connected both to the output of capacitor C1 and to ground. The input to transistor T2 is connected to a write (W) line while its gate is connected to a write enable (WE) word line.

To read the cell of FIG. 1, a pre-charge is applied to read line R and word line RE is activated (i.e. its voltage level is raised). With word line RE activated, transistor T1 is active, which, in turn, provides input to transistor T3. If capacitor C1 has charge (a logic "1" in one embodiment), transistor T3 will be activated, providing a path to ground (through transistors T1 and T3) and, as a result, discharging read line R. If capacitor C1 has no charge (a logic "0" in this embodiment), then T3 remains closed and read line R remains charged.

Figure 2:
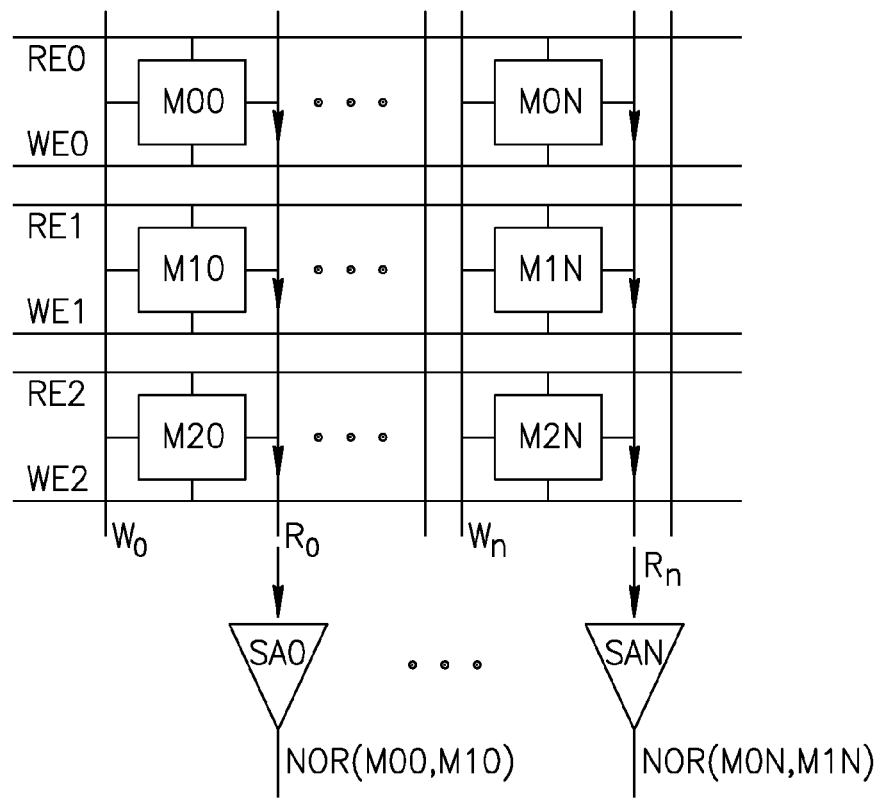
FIG. 2 is a circuit diagram illustration of a multiple read of a plurality of cells of FIG. 1.

Reference is now made to FIG. 2, which illustrates multiple cells of FIG. 1, implemented in a memory array. There are multiple word lines REi and WEi, defining rows where i=0, 1, 2, 3, ..., m−1, m; and multiple read lines Rj and write lines Wj, defining columns where j=0, 1, 2, 3, ..., n−1, n; where each read line Rj is connected on output to sensing circuitry SA.

Three rows are shown, rows 0, 1 and 2, with columns 0 through N. Each cell is formed at the intersection of a word line and a read line. Thus, cell M2N is in the second row, Nth column.

Applicants have realized that, if multiple word lines RE are activated at the same time, as shown, sensing circuits SA will sense a discharge of read lines R when any of the cells in their column discharge the line (i.e. if any of the cells in the column are 1s). Sensing circuitry SA will only sense a charge when all cells in the column are not charged (i.e. when all of them are 0s). Applicants have realized that this is a natural NOR of the activated cells in the column; it only produces a signal when the cells are all 0s. While this realization may not be useful for determining the values of the stored data (since one cannot know which cell or cells were unchanged), Applicants have realized that it is useful for implementing the kind of Boolean mathematics which is at the heart of all computing devices.

In FIG. 2, word lines RE0 and RE1 are activated, as are all read lines Rj. Cells M00-M0N and cells M10-M1N are activated and provide their signals to their read lines Rj. Each sensing circuit SAj may generate the NOR of M0j with M1j. Thus, multiple NOR operations may be performed, one per column. It will be appreciated that these NOR operations may be performed without any comparison circuitry.

If sensing circuits SA are implemented as inverters or if inverters are added to them, then they may generate the OR of the cells. Alternatively, if the charge on the memory cell is defined as a "0" (and a lack of charge is defined as a "1"), then the output of sensing circuits SA is a discharge (i.e. a 1 in this embodiment) when any of the cells in the column are 0 and a charge (i.e. a 0) only when all of the cells in the column are 1. This is an NAND of all activated cells. For this embodiment, implementing sensing circuits SA with inverters generates an AND. Thus, all four Boolean operations may be implemented with the read of multiple rows of the memory array.

It is well known that any circuit or logic may be built from NAND and AND gates alone. Thus, the Karnaugh Map Analysis, which creates optimized combinations of AND and OR operations required to implement a specific truth table, is applicable. Karnaugh Map Analysis is a standard tool for any hardware implementation of logic.

All the tools of circuit theory may be applied to the present invention, such as truth tables, look up tables, De-Morgan's Laws, etc.

Figure 3A:
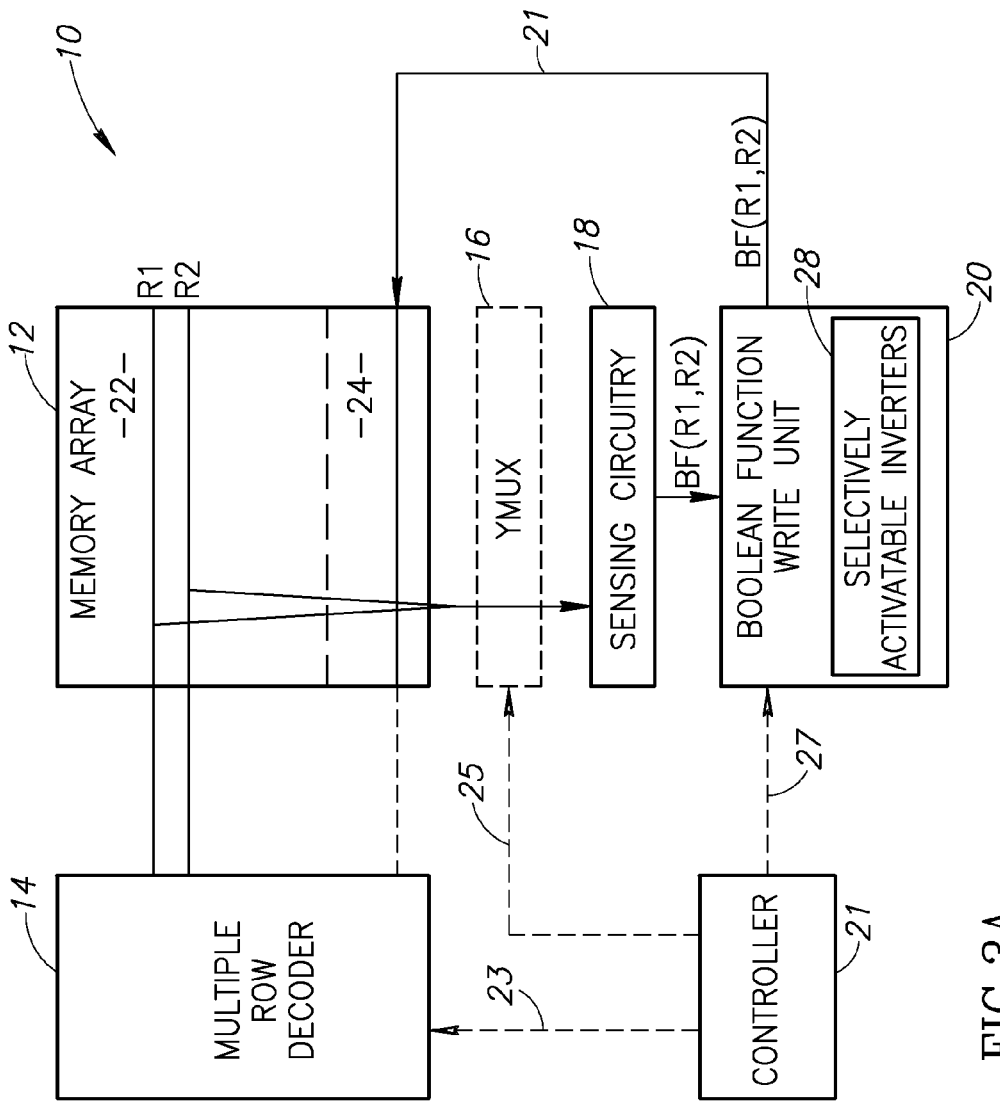
FIGS. 3A and 3B are schematic illustrations of an in-memory processor, constructed and operative in accordance with a preferred embodiment of the present invention.
Figure 3B:
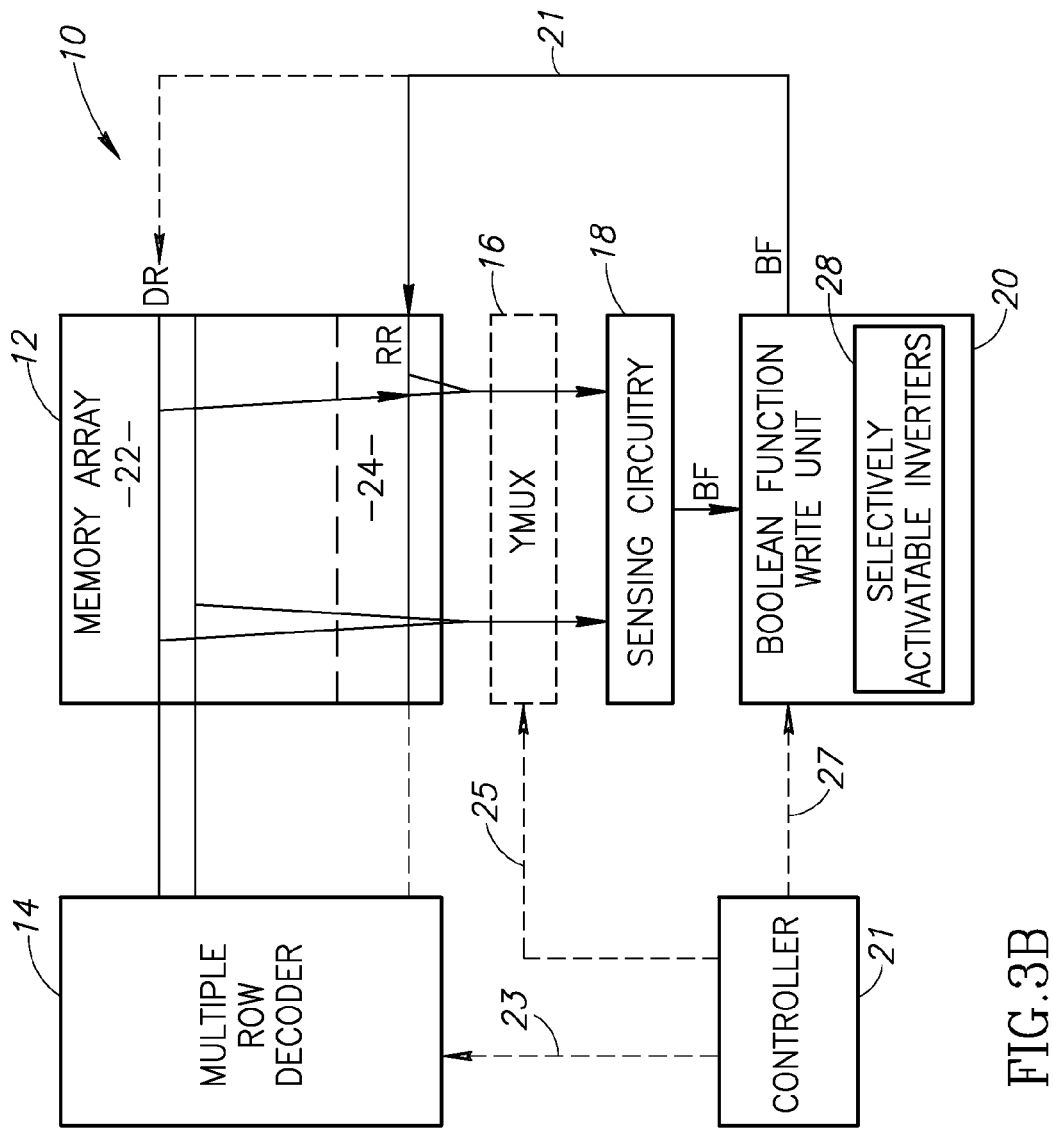

Reference is now made to FIGS. 3A and 3B, which illustrate an in-memory processor 10, constructed and operative in accordance with a preferred embodiment of the present invention. Processor 10 may comprise a memory array 12, a multiple row decoder 14, an optional YMUX 16, sensing circuitry 18, a Boolean function write unit 20 and a controller 21. Memory array 12 may be any suitable memory array, volatile or non-volatile, such as a RAM, a DRAM, an SRAM, etc., which may be pure memory cells, designed to store data only and with no additional circuitry within array 12. Boolean function write unit 20 may comprise selectively activatable inverters 28.

In accordance with a preferred embodiment of the present invention, memory array 12 may be a single memory array or may be divided into two sections, a data section 22, in which the data may be stored, and a processing section 24, which may receive the results of various types of processing on the data of data section 22. For the examples of FIGS. 3A and 3B, memory array 12 will be assumed to be divided into the two sections 22 and 24.

Multiple row decoder 14 may be any suitable row decoder able to decode more than one row at a time, as described in more detail hereinbelow. For reading, row decoder 14 may activate two or more rows of memory array 12 at a time. If all columns are to be processed at one time, in a massively parallel operation, then YMUX 16 is not necessary. However, if only some of the columns are to be processed, YMUX 16 may activate the selected read lines. Controller 21 may indicate to row decoder 14 which word lines to activate for the current operation. For operation on individual or selected columns, controller 21 may also indicate to YMUX 16 which read or write lines to activate.

Sensing circuitry 18 may be formed of any suitable sensing circuitry and may determine if the currently active read lines are discharged or not. Since row decoder 14 may have activated multiple rows, each read line will remain charged only if all of the activated memory cells connected in its column had uncharged capacitors. If any of the memory cells in the column had a charged capacitor, the read line will be discharged. Thus, as mentioned hereinabove, the output of each sensing circuit may be a Boolean function of the states of the memory cells in each column (where the Boolean function may depend on how the data is perceived (e.g. which state is considered the 0 state) and/or if the sensing circuits include inverters, such as selectively activatable inverters 28). Thus, if rows R1 and R2 of data section 22 were read out, sensing circuitry 18 may generate the Boolean function BF(R10,R2) of rows R1 and R2 as is shown in FIG. 3A.

As mentioned hereinabove, write unit 20 may include selectively activatable inverters 28 to invert the output of sensing circuitry 18, as necessary. Such inverters may be selectively operative, upon instructions from controller 21.

Controller 21 may indicate to Boolean function write unit 20 to write the output of sensing circuitry 18 (inverted or otherwise) back into memory array 12, for example, into processing section 24. If the output was a discharge, then write unit 20 may discharge the capacitor in the cell being written. Conversely, if the output was a charge, then write unit 20 may charge the capacitor in the cell being written. In the example of processing rows R1 and R2, write unit 20 may write BF(R1,R2) into processing section 24.

For the cells of FIG. 1, to effect the write operation, controller 21 may indicate (dashed line 23) to row decoder 14 to activate the write enable WE word line for the desired row of processing section 24, to optional YMUX 16 (dashed line 25) to activate the appropriate write W lines (alternatively, all write lines W may be activated) and to write unit 20 (dashed line 27) to provide the BF(R1,R2) it received and, possibly, inverted. It will be appreciated that other types of cells may require other types of lines to be activated.

It will be appreciated that in memory processor 10 may perform Boolean operations on the data stored in memory array 12 and, when operating on many columns, may imitate a massively parallel processing unit, all without the use of a bus to move data from a memory unit to the processing unit. The computations occur within the memory array, as a result of the read operation. Thus, in memory processor 10 may implement any Boolean gate, (NOR or otherwise), and any Boolean operation, on a single column, on multiple columns, or on all of the columns of the array, a massively parallel operation. Memory array 12 may be large, to implement massively parallel operations, or it may be a single column, to implement simple Boolean gates.

In accordance with a preferred embodiment of the present invention, multiple row decoder 14 may activate any sets of rows necessary. Some operations may require that only data rows (of data section 22) be activated while other operations may require that one or more of the rows to be activated be rows of processing section 24.

Standard row decoders activate a single row at a time. Multiple row decoder 14 may be formed from a combination of multiple row decoders. Alternatively, a multi-bit register, such as a 64-bit register, may be suitable. Such a register may store a pattern, where a bit value of 1 may activate a read enable line RE or a write enable line WE.

In another embodiment, write unit 20 may write over a row of data. For this embodiment, write unit 20 may be a selective write unit, such as is described in U.S. patent application Ser. No. 12/113,474, filed May 1, 2008 and assigned to the common assignees of the present application. Such a unit may generate tag flags for each cell, where a tag flag may be set to 1 when the output of write unit 20 is 1 and to 0 when the output is 0, or vice versa. The selective write operation may then activate only the write lines with a tag flag of 1 and may write either a 1 or a 0 to the cell, as appropriate.

In a further embodiment, write unit 20 may write more than one row of data when writing to memory array 12. Alternatively or in addition, write unit 20 may also write the complement of the result it received.

Figures 4, 5A:
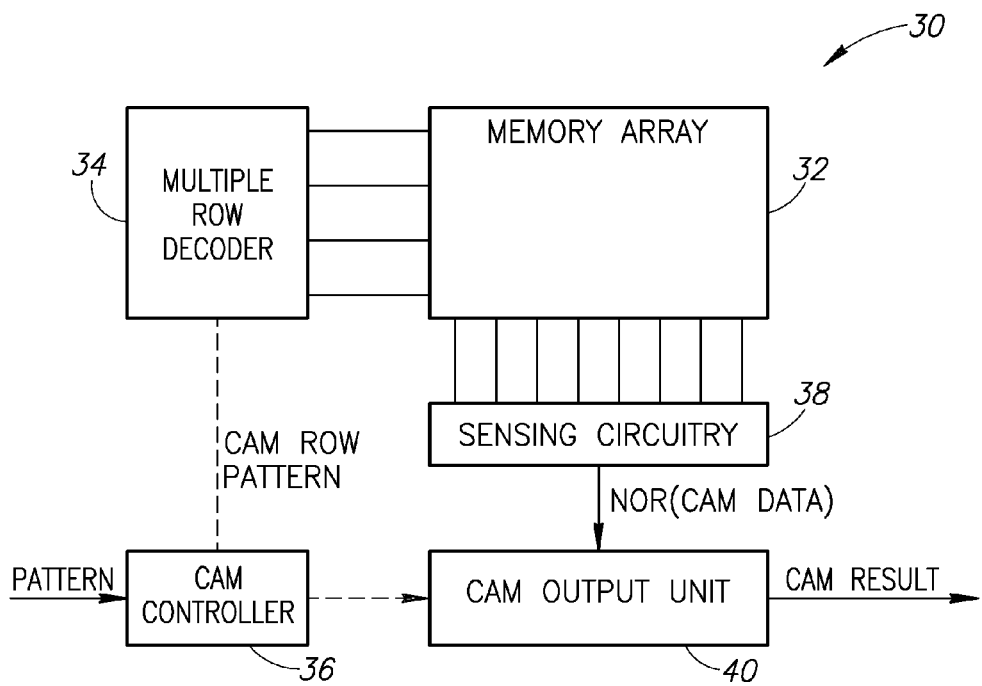
FIG. 4 is a truth table illustration of an exemplary set of operations of the processor of FIG. 3 to implement a full adder.
FIG. 5A is a schematic illustration of an in-memory content-addressable memory (CAM), constructed and operative in accordance with a preferred embodiment of the present invention.

Reference is now made to FIG. 4, which illustrates a truth table for implementing a full adder (i.e. an adder capable of adding two bits A and B with a carry C from a previous operation) Bits A and B and carry C are stored in different rows of the same column. The columns A, B and C of FIG. 4 list the possible values that the inputs A and B and carry C can have. The columns ~C, ~B, and ~A of FIG. 4 list the complements of columns C, B and A. To generate the new carry C1, controller 21 may execute the following exemplary operations:

T=NOR(~C,A,B)
T1=NOR(~C,T)
T2=NOR(C,~A,~B)
C1=OR(T1, T2)

In other words, in the first cycle, ~C, A and B may be read from memory array 12 and then written back into T, typically located in processing section 24. In the second cycle, ~C and T may be read and then written into T1. In the third cycle, C, ~A and ~B may be read and then Written into T2. Finally, to generate new carry C1 for the next operation, T1 and T2 may be read, inverted (to perform the OR operation) and then written into C1. Although FIG. 4 shows a truth table, and thus, the discussion above provides an explanation of the operation on single bits, it will be appreciated that the operations given above and below may be performed on single bits, multiple bits or entire rows of data, as instructed by controller 21. Each sensing circuitry receives the output of one calculation, which is the output of one column, and thus, operating on entire rows is a massively parallel operation.

To generate the new sum S1, controller 21 may execute the following exemplary operations:

T1=NOR(C,B,A)
T2=NOR(T1, T)
T1=NOR(~C,~B,~A)
S1=OR(T1,T2)

In other words, in the fifth cycle, C, B and A may be read from memory array 12 and then written back into T1. In the sixth cycle, T1 and T may be read and then written into T2. In the seventh cycle, ~C, ~B and ~A may be read and then written into T1. Finally, to generate new carry S1, T1 and T2 may be read, inverted and then written into S1. S1 and C1 may be stored in processing section 24 or in data section 22, as desired and instructed by controller 21.

It will be appreciated that the operations shown in FIG. 4 and discussed hereinabove are exemplary only; other series of Boolean operations may be performed to generate the same or similar results in more or fewer cycles. The present invention may be used to replace any logic gate and/or a set of logic gates in standard circuitry. Moreover, it may implement massively parallel logic gates.

If the complement values have not already been stored, then a few cycles may be devoted to generating them. To generate complements, the data of interest may be read and inverted via the inverter(s) in write unit 20. The result may be written into processing section 24. A complement operation may be performed once and the complement data may be reutilized for as many operations as necessary.

Inverters 28 may not be strictly required. An OR operation may be implemented by performing the NOR operation twice (since the single input NOR of a NOR is an OR). Thus, the data to be OR'd may be read and its NOR'd result written into cell(s) of the memory array 12 (with or without the selective write operation described hereinabove). The data of the processed cell(s) may then be read and the result may be the OR.

It will further be appreciated that the selective write operation described hereinabove may also be implemented without any hardware. In the selective write described hereinabove as illustrated in FIG. 3B, a compare operation was performed between a data row DR and a result row RR where the purpose of the operation is to use the results in results row RR to determine which bits in data row DR to change, what value to change them to and which bits in data row DR to leave unchanged. Result row RR is typically the result of one or more Boolean functions performed on one or more rows.

With the present invention, various operations may be performed on data row DR and result row RR, depending on the type of operation desired. For example, if it is desired to modify data row DR by writing a 1 in data row wherever there is a 1 in result row RR, controller 21 may instruct the operation of OR(RR,DR). To modify data row DR by writing a 1 wherever there is a 0 in result row RR, controller 21 may instruct the operation of OR(~RR,DR). Instructing AND(RR, DR) may write a 0 to data row DR wherever there was a 0 in result row RR and instructing AND(~RR,DR) may write a 0 to data row DR wherever there was a 1 in result row RR.

It will be appreciated that, in the operations illustrated herein and in other operations necessary for a computing device, there are no cycles wasted in copying the data between registers and a processing unit and there is no bus to slow the operation down. Moreover, there is no processing device and thus, the real estate on a chip required to implement a computing system may be significantly smaller.

The memory cell of FIG. 1 is known as a 3T DRAM cell. It is only one example of the type of memory cells for which the present invention is applicable. The present invention is applicable to any memory array which relies on line discharge to perform their read operation. Additionally, it may be possible to make bi-stable SRAM cells work with discharge.

The present invention is applicable to any memory array which may produce a determinate result when multiple rows may be read together. It may be applicable to DRAM as well, although DRAM spills its charge out when read. The stored value is determinate, but the charge is removed upon reading. Accordingly, DRAM includes circuitry to restore the read row. However, this is only applicable where one row is read at a time. If multiple rows are read at one time, there is no way to restore the data.

For the present invention, when operating with DRAM and other memory array types which destroy the data upon reading, an AND gate may be added for each column of the memory array, to AND a column and the value stored in an output row, stored in write unit 20. Each row may be activated separately and its output read into the AND gates for the activated columns. The AND gates may AND the output of the cells, for all separately activated rows, holding the result between activation of the rows. The output row may be refreshed at the end of each operation. For this embodiment, the array may perform the AND operation, rather than the NOR operation. Alternately, multiple rows can be read but then the original data is lost. This technique is restricted to situations where loss of data is acceptable or if the data about to be destroyed is first copied to a different location for future use.

In a further embodiment, sensing circuitry 18 may be unnecessary. Row decoder 14 may activate multiple rows for reading and may activate a row for writing at generally the same time. This is particularly apt for 3T DRAM cells, which have separate read and write enable lines and separate read and write column lines. Write unit 20 may initially activate the read lines and then may activate the write lines. Accordingly, other embodiments of this invention may use a modified 3T cell where the read and write lines are merged into a single line.

Figure 5B:
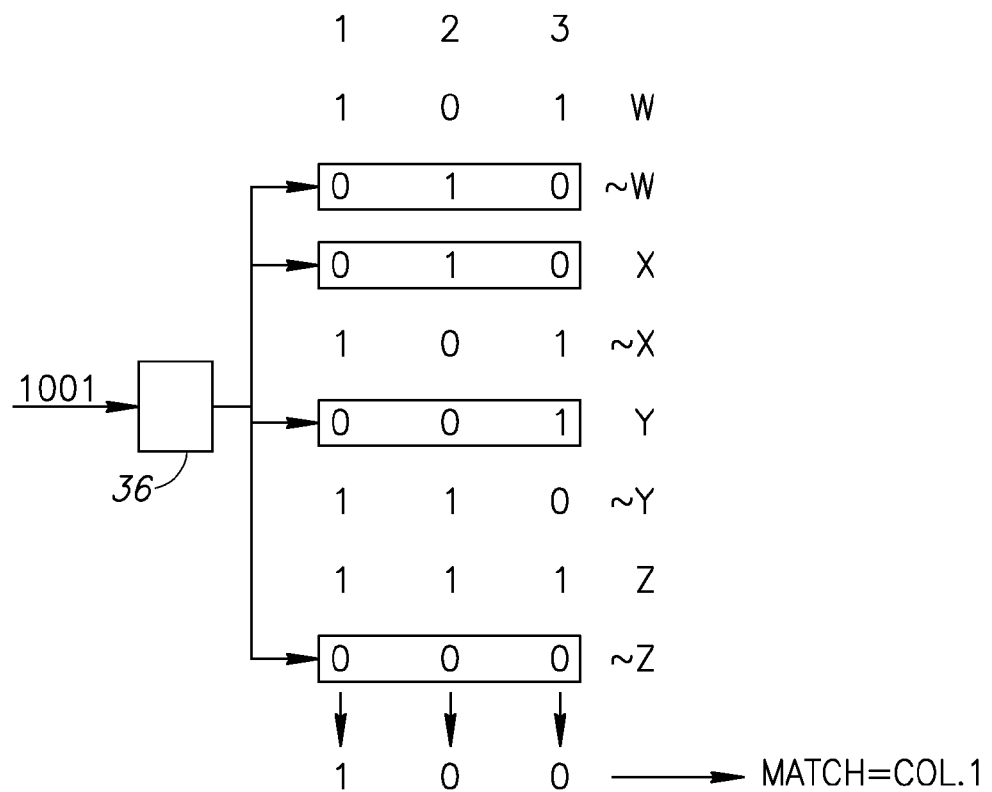
FIG. 5B is a schematic illustration of an exemplary operation of the CAM of FIG. 5A.

Reference is now made to FIG. 5, which illustrates an in-memory content-addressable memory (CAM) unit 30, constructed and operative in accordance with a preferred embodiment of the present invention, and to FIG. 5B, which illustrates its operation for finding a pattern of 1001.

CAM unit 30 may comprise a memory array 32, a multiple row decoder 34, a CAM controller 36, sensing circuitry 38 and a CAM output unit 40. Memory array 32 may be formed from any suitable memory array, such as the types of memory arrays discussed hereinabove, and may store the CAM data whose content is to be searched. Typically, each item of data, such as an address in a router, a telephone number, or any other information for which a hardware search is useful, may be stored in a column of memory array 32. Typically, memory array 32 may comprise a significant number of columns and may thus store a significant number of items of data.

CAM controller 36 may receive a CAM pattern to match and may indicate to multiple row decoder 34 to activate the appropriate rows of array 32 accordingly, as will be described in more detail hereinbelow. Sensing circuitry 38 may sense the Boolean function output of the multiple activated rows, typically for all columns, and may provide the output to CAM output unit 40. CAM output unit 40 may indicate which columns matched the input pattern.

For CAMs, a match between the input pattern and the data stored in a specific column should generate a 1 as the output for that column. However, recall that, in one embodiment of the present invention, when reading a single row, the present invention performs a NOR operation of that row. Specifically, when the activated cell has stored a charge (i.e. a 1), the present invention will generate a 0 (i.e., a discharge of the read line) for the entire column, an undesired result for CAMs.

Applicants have realized that, if the complement cell (a cell with no charge (i.e. a 0)) is activated, the present invention will generate a 1. Since, for a CAM, a match between the input pattern and the stored data in a column should always generate a 1 and, since in this invention, only a matched 0 may generate a 1, CAM controller 36 may activate whichever row (data or complement) may match a 0 to the data bits in the row. Thus, CAM controller 36 may activate the data row when the CAM pattern bit is a 0 (to generate a 1 wherever a 0 is stored in the data row) and may activate a complement row (which has a 0 whenever there is a 1 value in the data row) to generate a 1 when a 1 is present in the data row.

Thus, in accordance with a preferred embodiment of the present invention, each row of actual data may be stored as a row and its complement row. Accordingly, FIG. 5B shows rows W and ~W, X and ~X, etc.

FIG. 5B provides an exemplary illustration for an input pattern WXYZ of 1001. Three, four bit addresses may be stored in columns, with each bit being stored as two bits, in a data row, such as row W, and a complement row, such as row ~W. Column 1 may store the pattern 1001 (as 10,01,01,10), column 2 may store the pattern 0101 (as 01,10,01,10) and column 3 may store the pattern 1011 (as 10, 01, 10, 10). CAM controller 36 may receive the input pattern 1001 and may indicate to multiple row decoder 34 to activate the row pattern ~W, X, Y, ~Z (i.e. complement rows ~W and ~Z to find the 1s and data rows X and Y to find the 0s). The activated rows are boxed in FIG. 5B.

Column 1, for which the pattern 0000 is read upon activation of rows ~W, X, Y and ~Z, generates a match, as none of the activated cells discharge the read line (the activated cells are all 0s). Columns 2 and 3, for which the patterns 1100 and 0010 may read, do not generate a match, as their patterns include at least one 1 in them, which discharges their read lines. The result is a simultaneous matching of three columns to the input CAM pattern, resulting in only one successful match, column 1.

CAM output unit 40 may generate an output signal which has a 1 for each column for which there was a match.

There are CAMs which store binary data (1s and 0s), and CAMs which store ternary data, (1s, 0s and Xs (i.e. don't care)). The present invention may store an X by storing a 0 in the cell of both the data row and the complement row (for this embodiment, the complement row is not a perfect complement). Thus, if the data to be stored is 10X, the data rows may store 100 and the complement rows may store 010. Due to the stored X value, CAM unit 30 may find a match to both a 100 and a 101 input pattern.

The present invention may also store quadrary data, with bit values of 1, 0, X and Y (i.e. an always fail state). In this embodiment, the Y data may be stored by storing a 1 in the cell of both the data row and the complement row. Thus, if the pattern is 10Y, the data rows may store 101 and the complement rows may store 011. Due to the stored Y value, CAM unit 30 may not find a match to either a 100 or a 101 input pattern.

This always-fail functionality may be useful as one way of implementing an if/else functionality. In CAM unit 30, each column of memory array 32 may be seen as a full bit-wise Turing machine processor plus an arithmetic logic unit (ALU). The in-memory processor described hereinabove may read data, may write data and may perform arithmetic operations on the data of a column. There is therefore a need to implement basic if/else or branching functionality. Depending on this or other values in the same column, the branching logic may require that a specific column not participate in a specific calculation. One way of implementing this decision may be to write a 1 to both the data and its complement row. As a result, the specific column (with the 1 in its data and complement row) will always fail regardless of the input pattern, as long as the rows are part of the search.

Another, perhaps simpler example of the use of the always-fail feature is for invalid numbers. There are many database applications which may use a CAM for searching and these applications may want to include the concept of an invalid or out-of-range number.

It will be appreciated that CAM unit 30 may implement a CAM, but within a standard memory array and without any of the comparison circuitry which makes CAM cells so large and expensive to manufacture.

A parallel architecture for machine vision, which is based on an associative processing approach using CAM cells, is described in a PhD thesis by Akerib, entitled "Associative Real-Time Vision Machine," Department of Applied Mathematics and Computer Science, Weizmann Institute of Science, Rehovot, Israel, March, 1992, which is incorporated herein by reference. The thesis describes a method for producing massively parallel processing of a generic type using a CAM array and shows how to perform ALU and IF operations using a CAM array and by writing the results of operations back to the CAM array. It will be appreciated that the associative processing described in the PhD thesis may also be implemented with CAM unit 30.

It will be appreciated that the present invention may provide massively parallel, generic processing. In the embodiment of FIG. 3, each column in memory array 12 may implement a Boolean operation and these operations may be performed on multiple columns generally simultaneously. Multiple Boolean operations may implement any computing operation. The associative processing described in Akerib's thesis also provides massively parallel processing and may be performed using the embodiment of FIG. 5.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A CAM unit comprising:
    a memory array of storage cells comprising complement rows and associated data rows, wherein the complement rows and the data rows store data values and wherein at least one or more complement rows store data values complementary to data values stored in its associated data rows, and at least one or more complement rows store same data values as in its associated data rows;
    a multiple row decoder to activate more than one row of said memory array at a time; and
    a controller to receive an input pattern to be matched and to indicate to said multiple row decoder to activate data rows or complement rows responsive to the logical state of each bit in said input pattern;
    wherein an indication of any one of a "don't care" and an "always fail" state is when a complement row and its associated data row store the same data values.

2. The unit according to claim 1 and wherein said memory storage cells are 3T DRAM cells.

3. The unit according to claim 1 and wherein said memory storage cells are one of the following type of memory cells: SRAM cells, DRAM cells, and non-destructive cells.

4. The unit according to claim 1 and wherein said memory storage cells provide a determinate result when multiple cells are read together.

5. The unit according to claim 1 and wherein said CAM unit is a ternary CAM unit.

6. The unit according to claim 1 and wherein said CAM unit is a quadrary CAM unit.

* * * * *